US012757714B2

(12) United States Patent
Yoshimura

(10) Patent No.: US 12,757,714 B2
(45) Date of Patent: Oct. 6, 2026

(54) CAPACITIVE ELEMENT AND SEMICONDUCTOR DEVICE

(71) Applicant: ABLIC Inc., Nagano (JP)

(72) Inventor: Mitsuhiro Yoshimura, Nagano (JP)

(73) Assignee: ABLIC Inc., Nagano (JP)

( * ) Notice: Subject to any disclaimer, the term of this patent is extended or adjusted under 35 U.S.C. 154(b) by 339 days.

(21) Appl. No.: 18/608,970

(22) Filed: Mar. 19, 2024

(65) Prior Publication Data

US 2024/0332164 A1 Oct. 3, 2024

(30) Foreign Application Priority Data

Mar. 30, 2023 (JP) ................................ 2023-054476

(51) Int. Cl.
*H10W 20/41* (2026.01)
*H10D 1/68* (2025.01)

(52) U.S. Cl.
CPC .......... *H10W 20/423* (2026.01); *H10D 1/714* (2025.01)

(58) Field of Classification Search
CPC ............. H10W 20/423; H10W 20/496; H10W 20/495; H10D 1/714; H10D 1/62
See application file for complete search history.

(56) References Cited

U.S. PATENT DOCUMENTS 9,224,685 B1 * 12/2015 Ding ...................... H10D 1/711
9,312,221 B2 * 4/2016 Yen ........................ H10D 1/025
10,554,112 B1 * 2/2020 Sharma ............ H03K 17/08104
2005/0145987 A1 * 7/2005 Okuda ................ H10W 20/423 257/532
2006/0087004 A1 * 4/2006 Furumiya .............. H10D 1/042 257/532
2006/0197133 A1 * 9/2006 Jung ...................... H10D 1/692 257/E21.011
2006/0237819 A1 * 10/2006 Kikuta ................ H10W 20/496 257/532
2014/0367831 A1 * 12/2014 Yen ........................ H10D 1/025 257/595
2015/0016585 A1 * 1/2015 Toyotaka .............. G02F 1/1334 377/77
2016/0190231 A1 * 6/2016 Ishimaru .............. H10D 86/441 257/66
2024/0332164 A1 * 10/2024 Yoshimura ............... H10D 1/62

FOREIGN PATENT DOCUMENTS

CN 100420010 C * 9/2008 .......... H10W 20/496
CN 103258829 A * 8/2013 ....... H10F 39/80373
CN 105938838 A * 9/2016 ........... H10D 84/811
CN 106028931 A * 10/2016 ............... G07C 9/37
CN 106133753 A * 11/2016 ......... G06V 40/1306
(Continued)

*Primary Examiner* — Laura M Menz
(74) *Attorney, Agent, or Firm* — JCIPRNET

(57) ABSTRACT

A capacitive element 100 includes a P-type semiconductor substrate 110, a capacitor structure 150 formed above the P-type semiconductor substrate 110, and a shielding layer 130 formed between the P-type semiconductor substrate 110 and the capacitor structure 150 and electrically connected to the P-type semiconductor substrate 110. Preferably, a pair of electrodes 150*a* and 150*b* in the capacitor structure 150 are at a first potential V1 and a second potential V2 respectively, and the P-type semiconductor substrate 110 and the shielding layer 130 are at a third potential V3.

7 Claims, 10 Drawing Sheets

(56) References Cited

FOREIGN PATENT DOCUMENTS

| | | | | | |
|---|---|---|---|---|---|
| CN | 106409809 | | | 2/2017 | |
| CN | 106409809 | A | * | 2/2017 | .......... H10W 20/496 |
| CN | 108172565 | | | 6/2018 | |
| CN | 108172565 | A | * | 6/2018 | ............ H10W 42/00 |
| CN | 106409809 | B | * | 4/2019 | .......... H10W 20/496 |
| CN | 111937074 | A | * | 11/2020 | ......... G11C 11/4074 |
| CN | 108172565 | B | * | 12/2020 | ............ H10W 42/00 |
| CN | 115527491 | A | * | 12/2022 | ........... G09G 3/3233 |
| CN | 118738031 | A | * | 10/2024 | .......... H10W 20/423 |
| EP | 4447106 | A1 | * | 10/2024 | .......... H10W 20/423 |
| JP | 2005197396 | | | 7/2005 | |
| JP | 2006303220 | A | * | 11/2006 | .......... H10W 20/496 |
| JP | 2008117996 | A | * | 5/2008 | |
| JP | 2012109376 | A | * | 6/2012 | .......... H10W 20/496 |
| JP | 5569354 | B2 | * | 8/2014 | .......... H10W 20/496 |
| JP | 2016162904 | A | * | 9/2016 | ........... H10D 84/811 |
| JP | 2017076829 | | | 4/2017 | |
| JP | 2018081736 | A | * | 5/2018 | ......... G06F 1/13624 |
| JP | 2023075217 | A | * | 5/2023 | |
| JP | 2024142362 | A | * | 10/2024 | .......... H10W 20/423 |
| KR | 100640065 | B1 | * | 10/2006 | .......... H10W 20/496 |
| KR | 100699863 | B1 | * | 3/2007 | ........... H10F 39/024 |
| KR | 101146225 | B1 | * | 5/2012 | ............... H10D 1/68 |
| KR | 20200128166 | A | * | 11/2020 | ......... G02F 1/13624 |
| KR | 102428994 | B1 | * | 8/2022 | ............ H10P 50/283 |
| KR | 20240147499 | A | * | 10/2024 | .......... H10W 20/423 |
| TW | 202441752 | A | * | 10/2024 | .......... H10W 20/423 |
| WO | WO-2021090110 | A1 | * | 5/2021 | ........... H04N 25/709 |
| WO | WO-2023209493 | A1 | * | 11/2023 | ........... H10K 59/131 |
| WO | WO-2024013602 | A1 | * | 1/2024 | ........... H10D 30/031 |
| WO | WO-2024057168 | A1 | * | 3/2024 | ........... H10D 86/423 |

* cited by examiner

CAPACITIVE ELEMENT AND SEMICONDUCTOR DEVICE

CROSS-REFERENCE TO RELATED APPLICATION

This application claims the priority benefits of Japanese application no. 2023-054476, filed on Mar. 30, 2023. The entirety of the above-mentioned patent application is hereby incorporated by reference herein and made a part of this specification.

BACKGROUND

Technical Field

The present invention relates to a capacitive element and a semiconductor device.

Description of Related Art

Examples of the capacitive elements used in semiconductor integrated circuits include MIM (Metal-Insulator-Metal) capacitors having a structure of a plate-shaped electrode pair, and MOM (Metal-Oxide-Metal) capacitors using an inter-wiring capacitor of comb-shaped electrodes.

Compared to MIM capacitors, MOM capacitors have advantages such as the capability to realize minute capacitance values and increase the capacitance density as the process becomes finer.

The MOM capacitor often has a comb-shaped capacitor structure formed in multiple wiring layers by a BEOL (Back End of Line) process. A technique has been proposed to suppress unintended electrostatic coupling in such a capacitor structure by providing a shield electrode around to shield the electric field between the electrodes of the capacitor structure in order to prevent the generation of unnecessary parasitic capacitance. In addition, a technique has been proposed which can eliminate the need for a side shield electrode by forming the comb-shaped electrode pair, which is electrostatically coupled by the electric field in the in-plane direction, into a closed loop shape arranged concentrically in a plan view.

An aspect of the present invention provides a capacitive element which is capable of suppressing fluctuations in capacitance value due to application of a voltage.

SUMMARY

A capacitive element according to an embodiment of the present invention includes:

- a semiconductor substrate;
- a capacitor structure formed above the semiconductor substrate; and
- a shielding layer formed between the semiconductor substrate and the capacitor structure and electrically connected to the semiconductor substrate.

According to one aspect of the present invention, the present invention provides a capacitive element which is capable of suppressing fluctuations in capacitance value due to application of a voltage.

DESCRIPTION OF THE EMBODIMENTS

The present invention is based on the following findings.

Figure 7A:
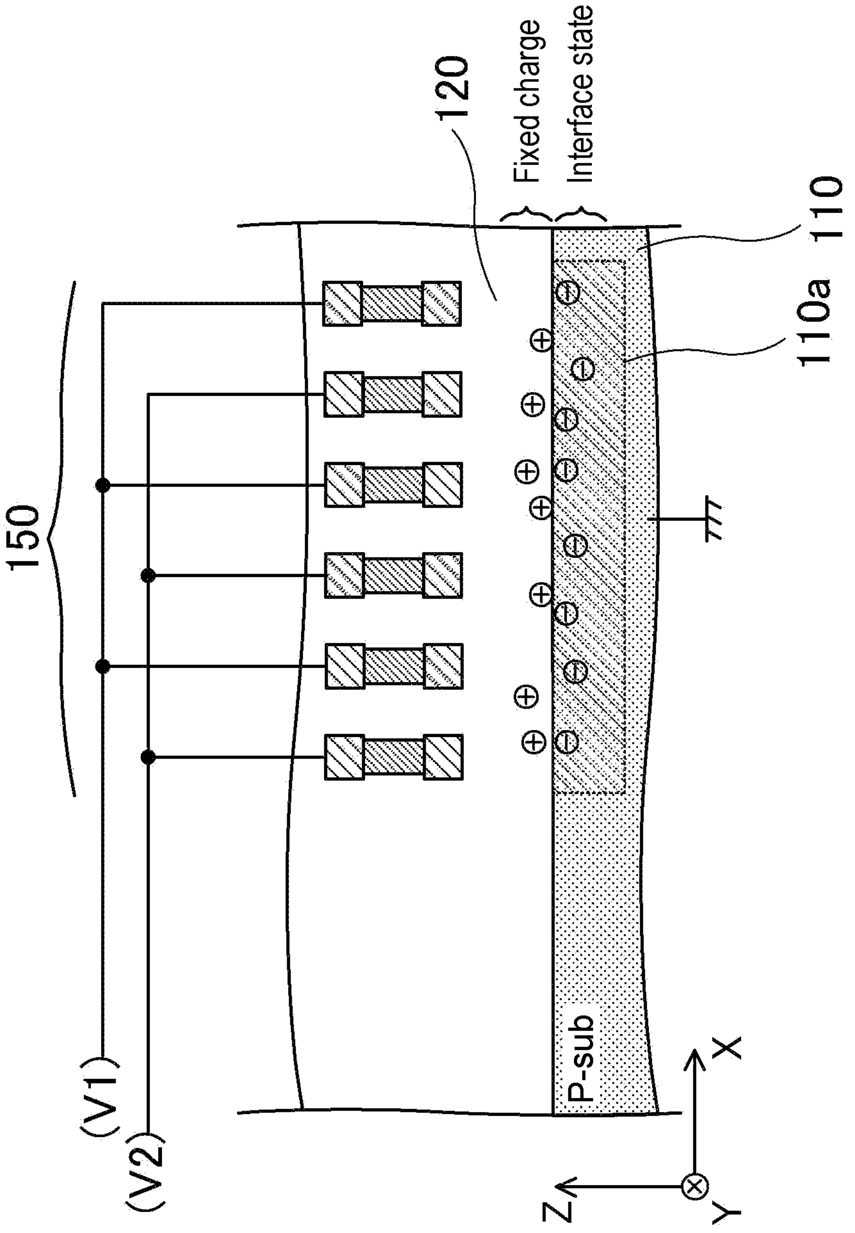
FIG. 7A is an explanatory diagram illustrating a state near the interface of the semiconductor substrate in the conventional capacitive element.

A capacitor structure such as a MOM capacitor is formed by deposited films stacked on a semiconductor substrate. As illustrated in FIG. 7A, such a capacitor structure 150 may be formed on a thick element isolation insulating layer 120 which is formed on a P-type semiconductor substrate 110 in order to reduce parasitic capacitance. In this case, parasitic capacitance can be reduced, but defects exist because the bonds between atoms at the interface of the deposited films are not perfect, and fixed charges and electrical levels are generated near the interface between the P-type semiconductor substrate 110 and the element isolation insulating layer 120 due to the defects. Fixed charges near this interface are often positive charges, and in the case where potentials V1 and V2 are applied to the capacitor structure 150 and an electric field from the capacitor structure 150 is applied, the positive charges generate a depletion layer 110*a* on the front surface of the P-type semiconductor substrate 110. Furthermore, electrons move in and out of levels due to the defects in the P-type semiconductor substrate 110, making the depletion of the front surface of the P-type semiconductor substrate 110 unstable.

In addition, even if the element isolation insulating layer is a LOCOS (Local Oxidation of Silicon) oxide film and a dense oxide film is formed on the semiconductor substrate using a thermal oxidation method, a thickness of several hundred nm or more is required for element isolation, so the interface has many oxygen-induced defects.

Figure 7B:
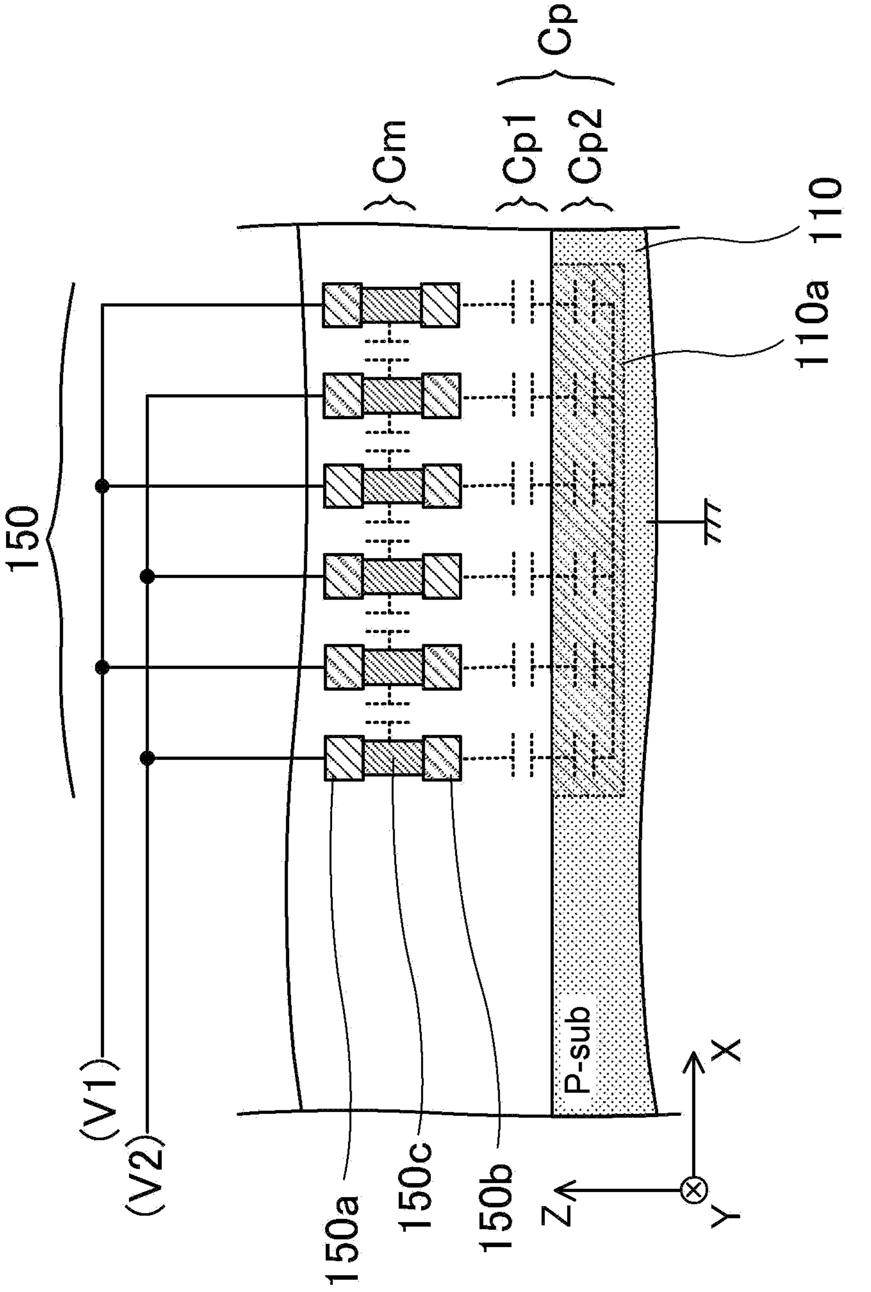
FIG. 7B is an explanatory diagram illustrating the location where capacitance (including parasitic capacitance) occurs in the conventional capacitive element.

Regarding the capacitor structure 150 formed on the element isolation insulating layer 120, as illustrated in FIG. 7B, the element isolation insulating layer 120 and the depletion layer 110*a* in the P-type semiconductor substrate 110 act on the parasitic capacitance Cp with respect to the main capacitance Cm of the MOM capacitor, resulting in a capacitance value larger than a desired value. In this parasitic capacitance Cp, the parasitic capacitance Cp1 based on the element isolation insulating layer 120 does not fluctuate electrically or transiently, but the parasitic capacitance Cp2 based on the depletion layer 110*a* formed in the P-type semiconductor substrate 110 fluctuates due to the external electric field as described above. That is, in the following equation, MOM capacitance-Cm+Cp1+Cp2, the parasitic capacitance Cp2 varies due to the external electric field including the capacitor structure 150.

Figure 7C:
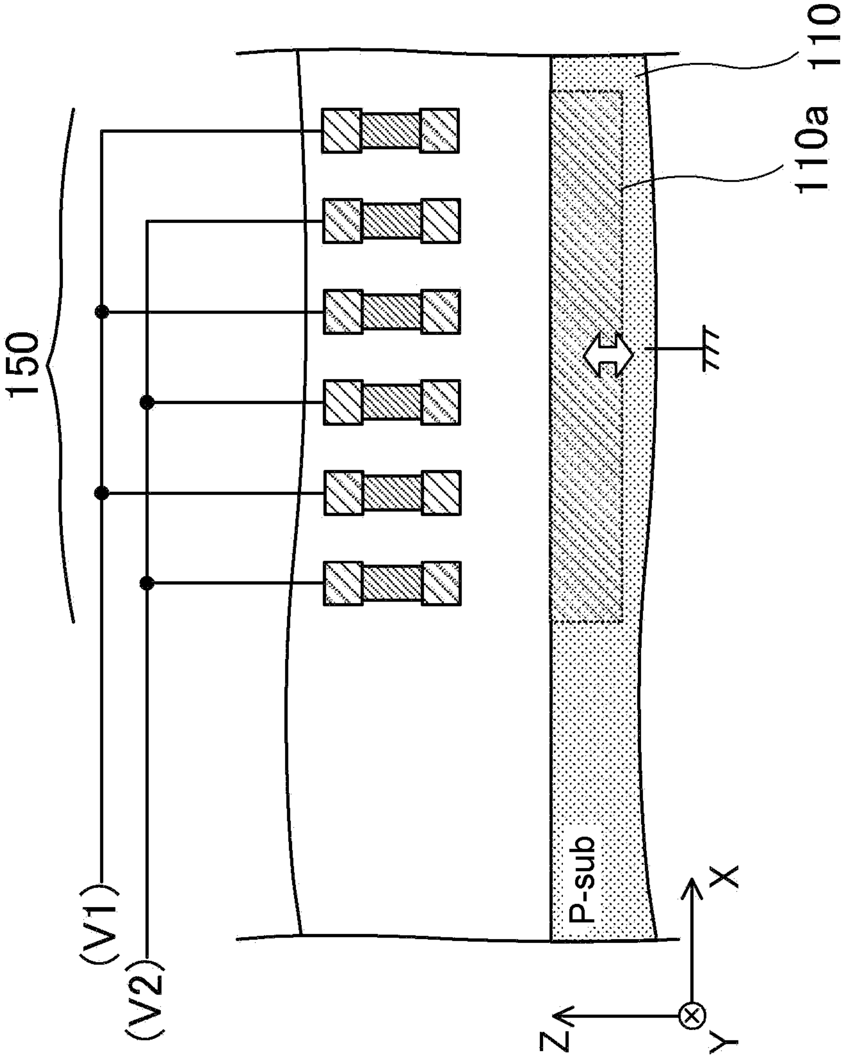
FIG. 7C is an explanatory diagram illustrating expansion and contraction of the depletion layer of the semiconductor substrate in the conventional capacitive element.

Specifically, as illustrated in FIG. 7C, in response to a positive potential being applied to one electrode forming the capacitor structure 150 with respect to the P-type semiconductor substrate 110 which is at the GND potential, the depletion layer 110*a* expands below the P-type semiconductor substrate 110, and contracts in the case where electrons are attracted to and captured at the front surface of the P-type semiconductor substrate 110.

Figure 7D:
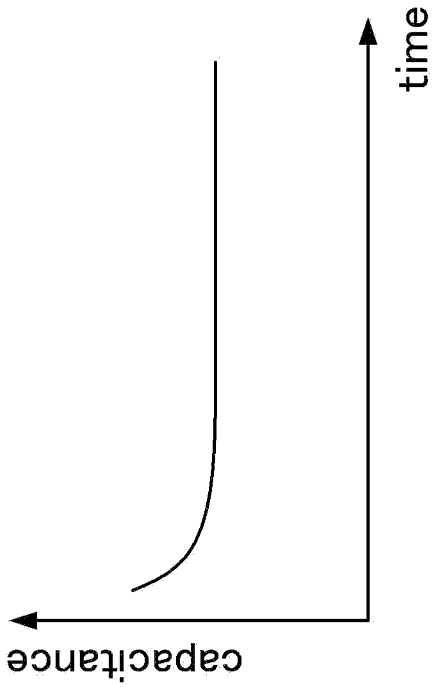
FIG. 7D is a graph illustrating fluctuations in capacitance value due to application of a voltage in the conventional capacitive element.

The inventor(s) observed the time fluctuation of the capacitance value of the MOM capacitor and found that the fluctuation gradually decreases from the start of application of a voltage and stabilizes within a few seconds, as illustrated in FIG. 7D. Such behavior can be described as follows.

That is, in the two phenomena, a case where a positive potential is applied to the capacitor structure and a case where electrons are captured at the interface, the influence of the levels close to the semiconductor substrate side is greater, so as electrons are captured in the levels, the positive charges of the fixed charges are canceled out, the depletion layer shrinks, and the capacitance value thereof becomes smaller. Such electron capture occurs relatively slowly compared to the expansion of the depletion layer due to potential application. Thus, when observing the capacitance value, the value changes over time to become smaller, and stabilizes as electron capture ends.

However, in related art, there is no mention or suggestion that the depletion layer of the semiconductor substrate expands and contracts due to the electric field from the capacitor structure in response to a potential being applied, and that this suppresses fluctuations in parasitic capacitance, and the techniques described in related art cannot suppress this capacitance value fluctuation.

Figure 1:
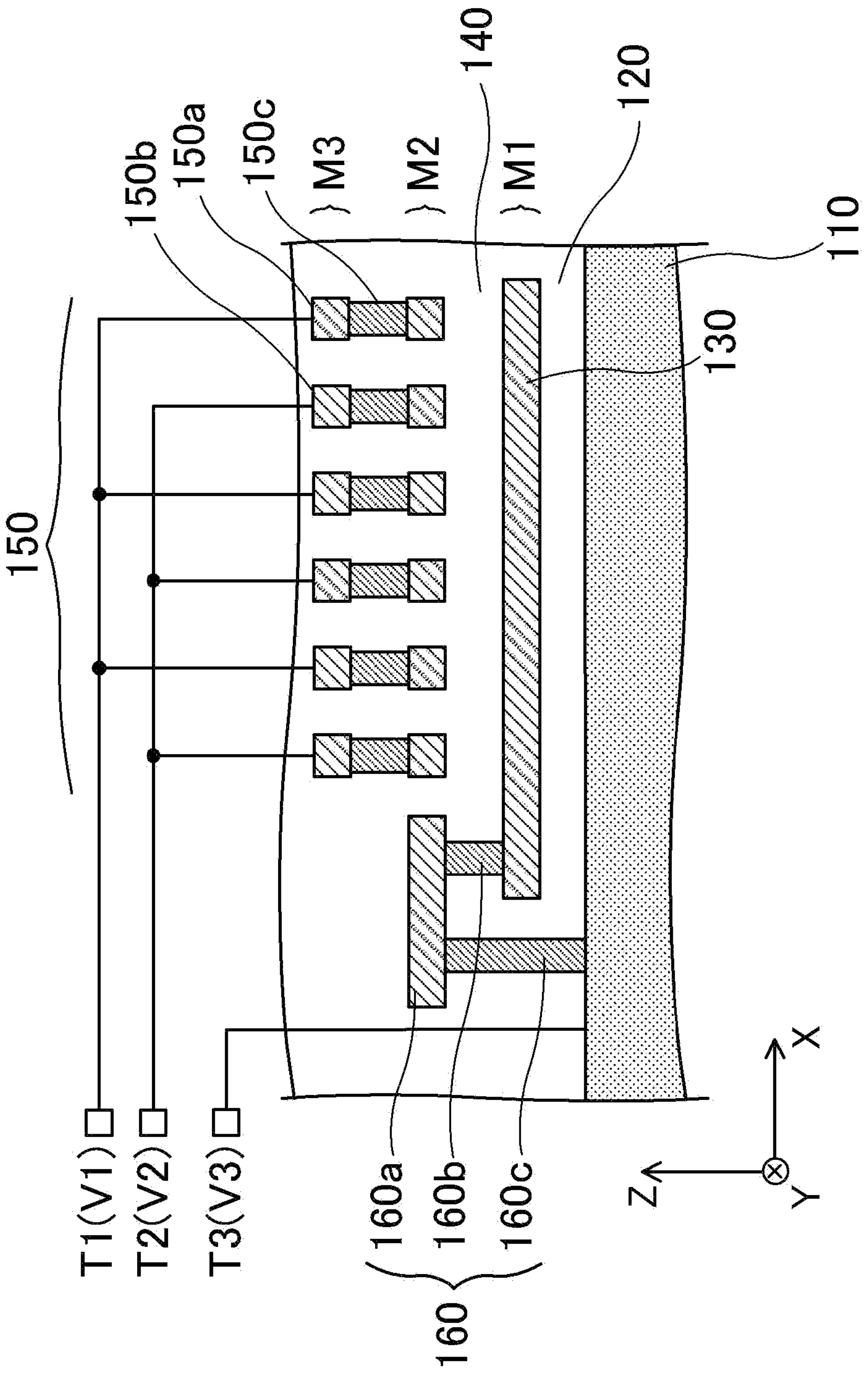
FIG. 1 is a schematic cross-sectional view illustrating the capacitive element in the first embodiment.

Thus, in an embodiment of the present invention, as illustrated in FIG. 1, a shielding layer 130 having the same potential as the P-type semiconductor substrate 110 is disposed between the capacitor structure 150 and the P-type semiconductor substrate 110. This shielding layer 130 makes the P-type semiconductor substrate 110 less susceptible to the influence of the electric field generated by applying a voltage to the capacitor structure 150, so that fluctuations in parasitic capacitance due to expansion and contraction of the depletion layer formed in the P-type semiconductor substrate 110 are reduced, thereby suppressing fluctuations in capacitance value.

Hereinafter, an embodiment of the present invention will be described in detail with reference to the drawings.

In the drawings, the same components are given the same reference numerals, and redundant description may be omitted.

Furthermore, it is assumed that the X-axis, Y-axis, and Z-axis illustrated in the drawings are orthogonal to one another. The X-axis direction may be referred to as the "width direction," the Y-axis direction may be referred to as the "depth direction," and the Z-axis direction may be referred to as the "height direction" or the "thickness direction." The surface of each film on the +Z direction side may be referred to as the "front surface" or "upper surface," and the surface on the −Z direction side may be referred to as the "back surface" or "lower surface."

In addition, the drawings are schematic, and the width, depth, thickness ratio, etc. are not drawn to scale. The quantity, position, shape, structure, size, etc. of a plurality of films or layers, or a semiconductor element obtained by structurally combining these, are not limited to the embodiments illustrated below, and can be set to preferable quantity, position, shape, structure, size, etc. in implementing the present invention.

First Embodiment

[Capacitive Element]

FIG. 1 is a schematic cross-sectional view illustrating the capacitive element in the first embodiment.

As illustrated in FIG. 1, a capacitive element 100 includes a P-type semiconductor substrate 110, an element isolation insulating layer 120, a shielding layer 130, an interlayer insulating film 140, a capacitor structure 150, and a conductive portion 160. This capacitive element 100 is formed on the element isolation insulating layer 120 using STI (Shallow Trench Isolation).

The P-type semiconductor substrate 110 is a wafer-shaped P-type silicon semiconductor substrate. This P-type semiconductor substrate 110 is supplied with a third potential V3 from a terminal T3.

The element isolation insulating layer 120 is a layer in which a silicon oxide film is deposited by STI.

The shielding layer 130 is formed between the P-type semiconductor substrate 110 and the capacitor structure 150. That is, the shielding layer 130 is formed on a metal wiring layer M1. This metal wiring layer M1 and metal wiring layers M2 and M3 forming the capacitor structure 150, which will be described later, are made of an aluminum alloy. Further, the potential of the shielding layer 130 is the same as the potential of the P-type semiconductor substrate 110 through the conductive portion 160.

The interlayer insulating film 140 is a silicon oxide film doped with phosphorus and boron (hereinafter referred to as a "BPSG (Boro-Phospho Silicate Glass) film"). The interlayer insulating film 140 is formed multiple times over the entire upper surface of the P-type semiconductor substrate 110 so as to cover the shielding layer 130, the capacitor structure 150, and the conductive portion 160.

The capacitor structure 150 is formed above the shielding layer 130 and includes a pair of electrodes 150*a* and 150*b*.

Figure 2:
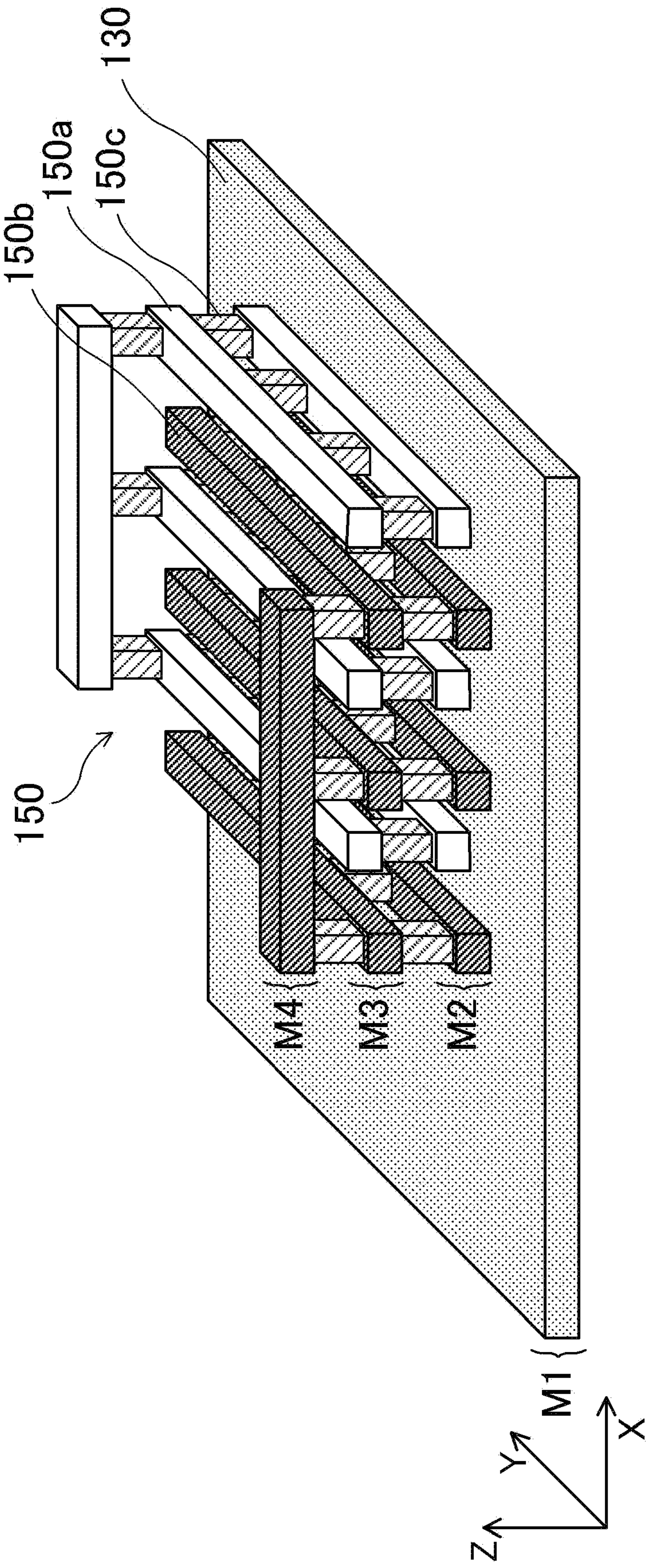
FIG. 2 is a schematic perspective view illustrating the capacitor structure and the shielding layer in the first embodiment.

As illustrated in FIG. 2, the pair of electrodes 150*a* and 150*b* are an interdigitated electrode pair, and electrodes of the same shape are formed to overlap with the metal wiring layers M2 and M3. A plurality of via plugs 150*c* are electrically connected between the metal wiring layers M2 and M3 respectively. Thus, in the case where the pair of electrodes 150*a* and 150*b* are supplied with the first potential V1 and the second potential V2 from the terminals T1 and T2 respectively via a wiring layer (not illustrated) or the like, electrostatic coupling occurs in the electric field in the in-plane direction (X-axis direction) caused by the potential difference, which generates the main capacitance.

If the shielding layer 130 does not exist, the parasitic capacitance between the pair of electrodes 150*a* and 150*b* and the P-type semiconductor substrate 110 is generated by the electrostatic coupling in the electric field in the normal direction (Z-axis direction) due to the potential differences respectively between the first potential V1 and the second potential V2 of the pair of electrodes 150*a* and 150*b* and the third potential V3 of the P-type semiconductor substrate 110. In this embodiment, the shielding layer 130 having the same potential as the P-type semiconductor substrate 110 disposed between the capacitor structure 150 and the P-type semiconductor substrate 110 is capable of shielding the electric field to the P-type semiconductor substrate 110. As a result, fluctuations in parasitic capacitance due to expansion and contraction of the depletion layer formed in the P-type semiconductor substrate 110 are reduced, thereby suppressing fluctuations in capacitance value.

Further, the shielding layer 130 is formed to overlap with the capacitor structure 150 so as to surround the periphery of the capacitor structure 150 in a plan view. Thus, the electric field from the capacitor structure 150 is less likely to enter the P-type semiconductor substrate 110, and fluctuations in parasitic capacitance due to expansion and contraction of the depletion layer formed in the P-type semiconductor substrate 110 are reduced, thereby suppressing fluctuations in capacitance value.

Regarding the first potential V1 to the third potential V3, for example, the first potential V1 is +5V, the second potential V2 is +80V, and the third potential V3 is 0V.

The conductive portion 160 is formed to be capable of electrically connecting the P-type semiconductor substrate 110 and the shielding layer 130 through a wiring 160*a*, a via plug 160*b*, and a contact plug 160*c*.

The wiring 160*a* is made of an aluminum alloy in the metal wiring layer M2.

The via plug 160*b* is formed by opening a via hole in the interlayer insulating film 140.

The contact plug 160*c* is formed by opening a contact hole in the element isolation insulating layer 120 and the interlayer insulating film 140.

[Semiconductor Device]

A semiconductor device 10 can be selected as appropriate according to the purpose as long as the capacitive element 100 is included, but the semiconductor device 10 preferably has a circuit which utilizes the difference or ratio of outputs of a plurality of capacitive elements 100 disposed.

Specific examples of the semiconductor device 10 may include an A/D (Analog/Digital) converter which has a switched capacitor integration circuit using a plurality of capacitive elements 100. In the case where the semiconductor device 10 is an A/D converter and has the above-mentioned switched capacitor integration circuit, the capacitance value is difficult to change immediately after a voltage is applied to the capacitive element 100, so the gain is stable and accurate A/D conversion can be performed. This effect is particularly enhanced as the voltage applied to the capacitive element 100 increases.

Thus, in the first embodiment, the shielding layer 130 having the same potential as the P-type semiconductor substrate 110 is disposed between the capacitor structure 150 and the P-type semiconductor substrate 110. This shielding layer 130 makes the P-type semiconductor substrate 110 less susceptible to the influence of the electric field generated by applying a voltage to the capacitor structure 150, so that fluctuations in parasitic capacitance due to expansion and contraction of the depletion layer formed in the P-type semiconductor substrate 110 are reduced, thereby suppressing fluctuations in capacitance value.

Second Embodiment

Figure 3:
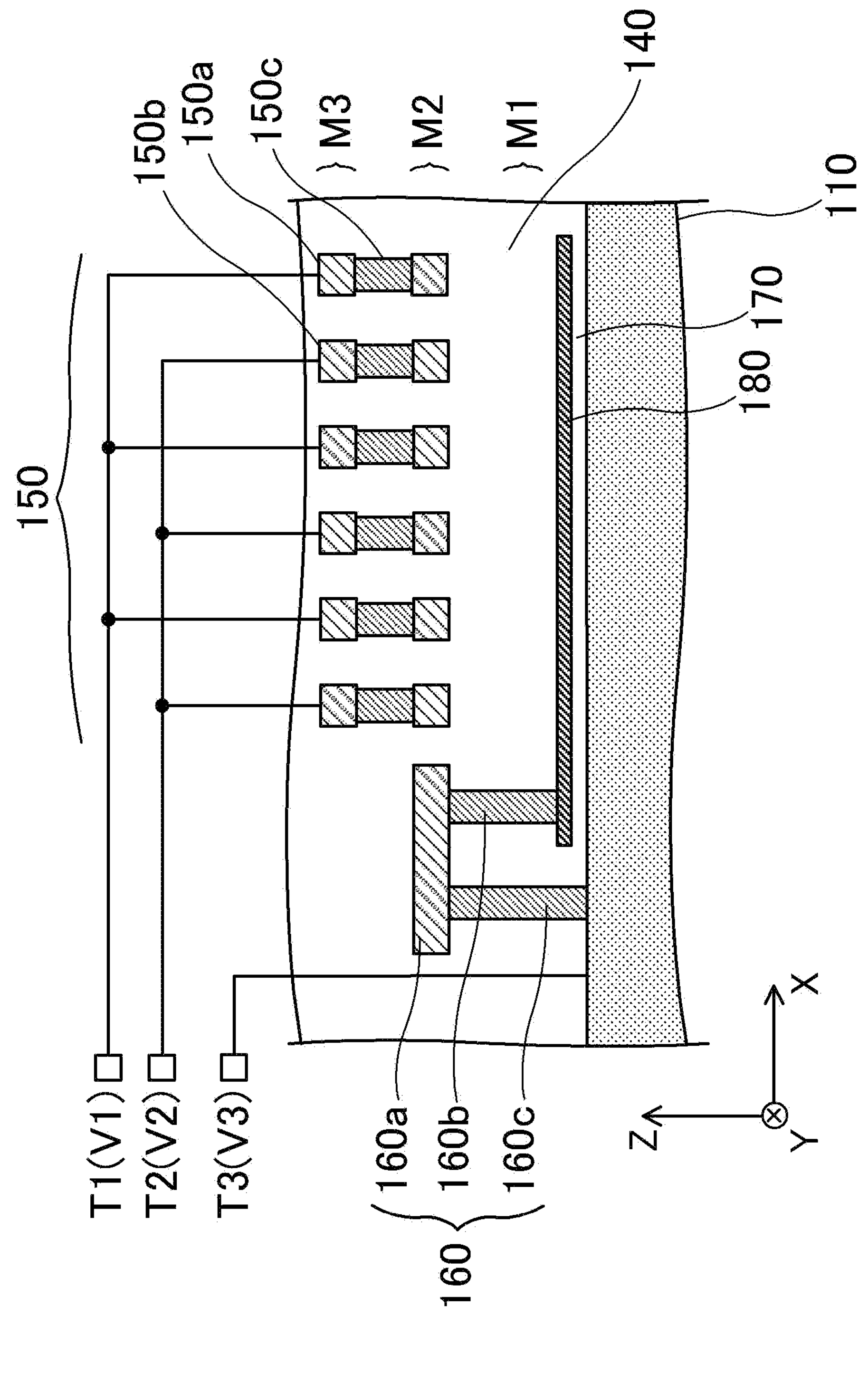
FIG. 3 is a schematic cross-sectional view illustrating the capacitive element in the second embodiment.

FIG. 3 is a schematic cross-sectional view illustrating the capacitive element in the second embodiment.

As illustrated in FIG. 3, the second embodiment is the same as the first embodiment except that the element isolation insulating layer 120 of the first embodiment is replaced with a thermal oxide film 170 and the shielding layer 130 is replaced with a conductive polysilicon layer 180.

The thermal oxide film 170 is an oxide film formed by thermally oxidizing the front surface of the P-type semiconductor substrate 110, and is a so-called gate insulating film. The thermal oxide film 170 has a more stable interface with the P-type semiconductor substrate 110 than the element isolation insulating layer 120 deposited on the P-type semiconductor substrate 110 in the first embodiment, and is less likely to generate interface states.

The conductive polysilicon layer 180 is a so-called gate electrode, and a P-type impurity or an N-type impurity is implanted to a high concentration into the polysilicon layer formed on the thermal oxide film 170.

Thus, in the second embodiment, the element isolation insulating layer 120 of the first embodiment is replaced with the thermal oxide film 170 to make it difficult to generate interface states in the P-type semiconductor substrate 110, which suppresses the generation of a depletion layer and thus reduces fluctuations in parasitic capacitance and suppresses fluctuations in capacitance value.

Third Embodiment

Figure 4:
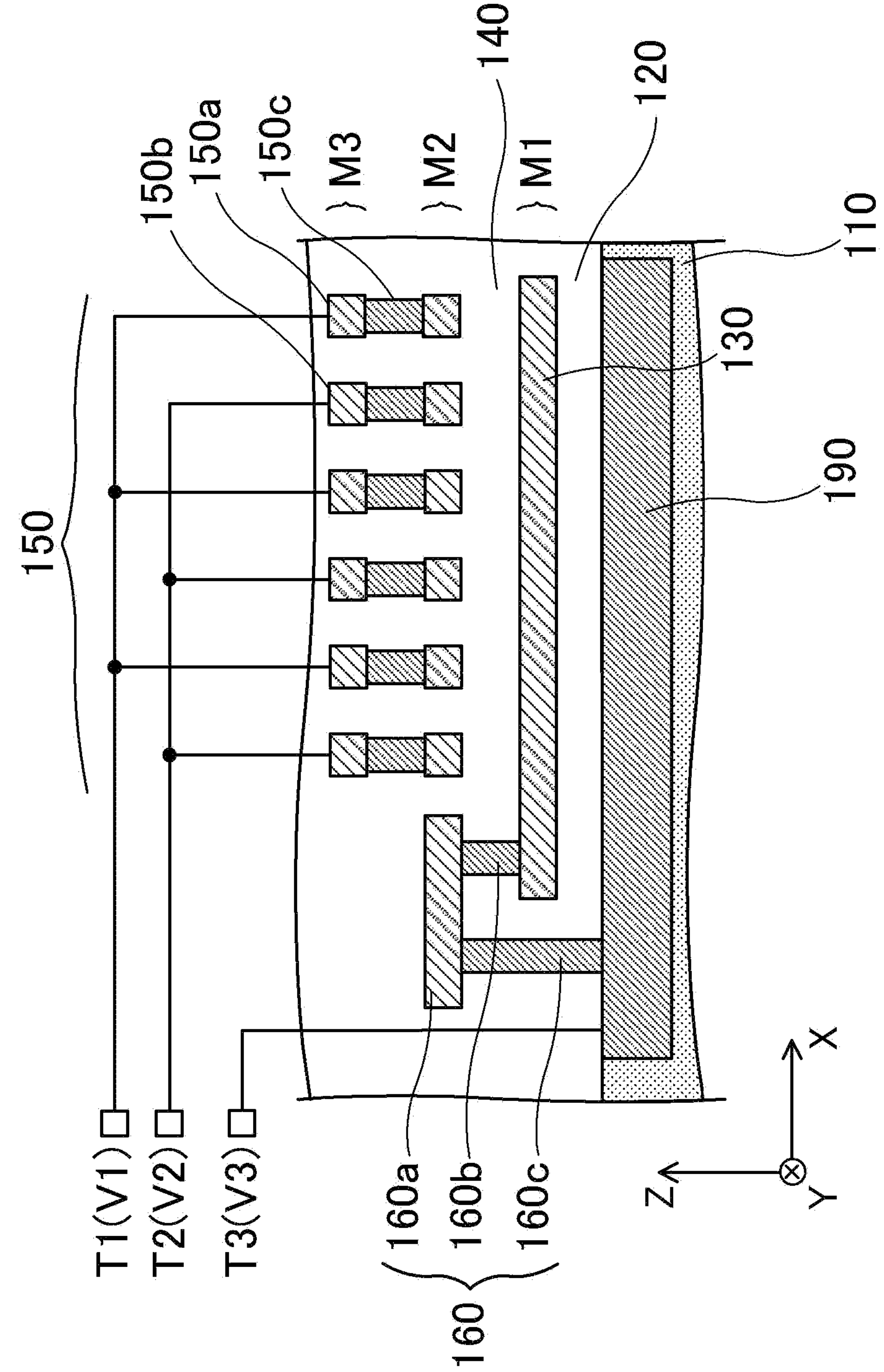
FIG. 4 is a schematic cross-sectional view illustrating the capacitive element in the third embodiment.

FIG. 4 is a schematic cross-sectional view illustrating the capacitive element in the third embodiment.

As illustrated in FIG. 4, the third embodiment is the same as the first embodiment except that an N-type well region 190 is formed on the front surface of the P-type semiconductor substrate 110 of the first embodiment, and the third potential V3 is applied to this N-type well region 190.

The N-type well region 190 is formed by implanting an N-type impurity into the front surface of the P-type semiconductor substrate 110. The third potential V3 is applied not to the P-type semiconductor substrate 110 but to the N-type well region 190.

Further, in order to prevent electrostatic coupling by weakening the electric field in the normal direction due to the potential difference between the first potential V1 and the third potential V3 and the potential difference between the second potential V2 and the third potential V3, the range of the third potential V3 is preferably between the first potential V1 and the second potential V2. Moreover, in this range, the third potential V3 is more preferably an intermediate potential between the first potential V1 and the second potential V2.

Furthermore, the N-type well region 190 is formed to overlap with the shielding layer 130 so as to surround the periphery of the shielding layer 130 in a plan view.

As a result, the electric field from the capacitor structure 150 is less likely to enter the P-type semiconductor substrate 110, and fluctuations in parasitic capacitance due to expansion and contraction of the depletion layer formed in the P-type semiconductor substrate 110 are reduced, thereby suppressing fluctuations in capacitance value.

Thus, in the third embodiment, the N-type well region 190 is formed on the front surface of the P-type semiconductor substrate 110, which suppresses the generation of a depletion layer and thus reduces fluctuations in parasitic capacitance and suppresses fluctuations in capacitance value.

Fourth Embodiment

Figure 5:
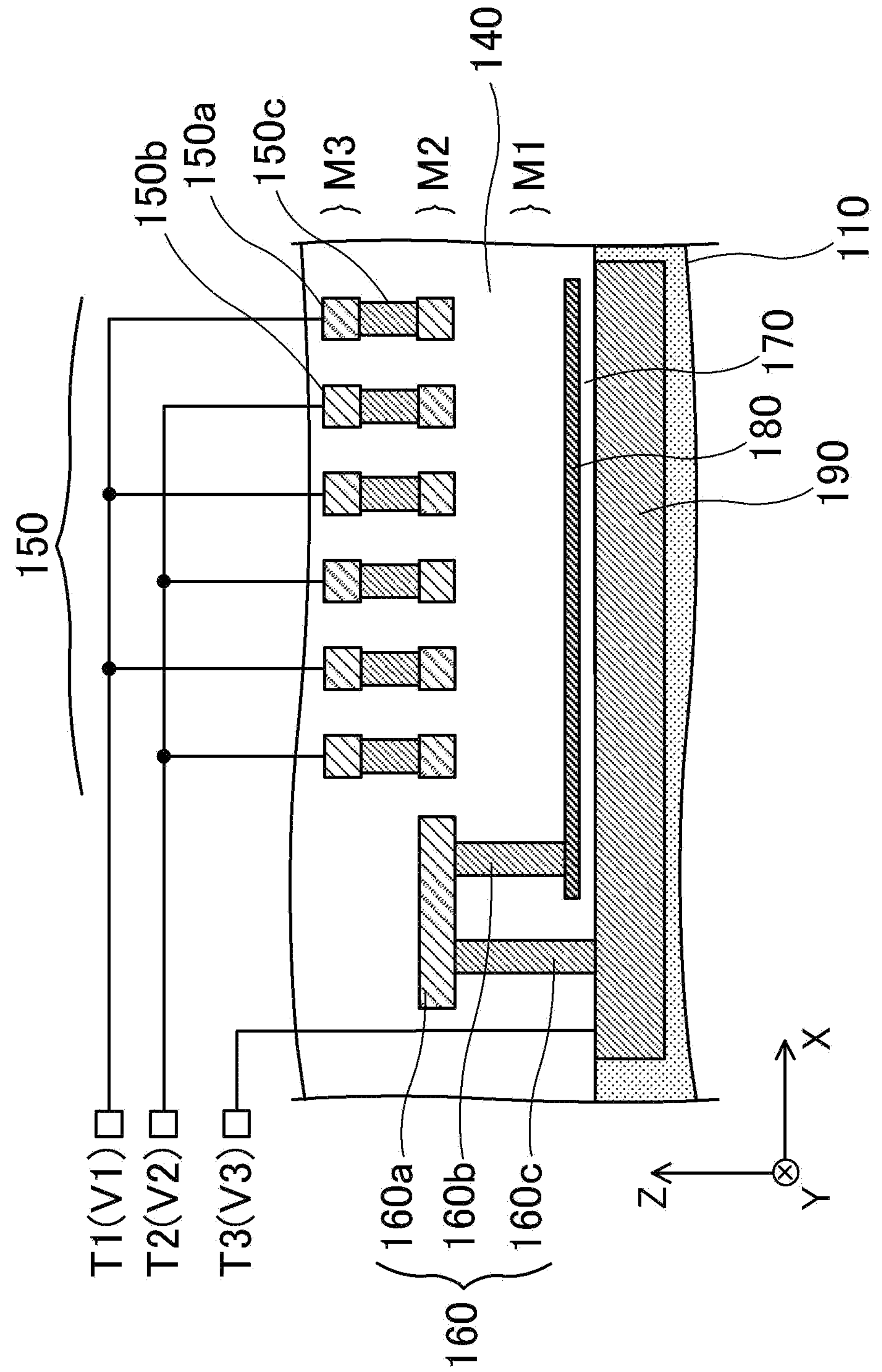
FIG. 5 is a schematic cross-sectional view illustrating the capacitive element in the fourth embodiment.

FIG. 5 is a schematic cross-sectional view illustrating the capacitive element in the fourth embodiment.

As illustrated in FIG. 5, the fourth embodiment is a combination of the second embodiment and the third embodiment. That is, the fourth embodiment is the same as the second embodiment except that the N-type well region

190 is formed on the front surface of the P-type semiconductor substrate 110 in the second embodiment and the third potential V3 is applied to this N-type well region 190.

The fourth embodiment is capable of obtaining the combined effects of the second embodiment and the third embodiment. Further, in the fourth embodiment, the conductivity type of the conductive polysilicon layer 180 is preferably N type. This is because, in the case where the conductivity type of the conductive polysilicon layer 180 is N type, even if an N-type impurity is implanted to a high concentration into the polysilicon layer at the time of forming the conductive polysilicon layer 180, it hardly affects the N-type well region 190 of the same conductivity type which exists in the layer below.

Since the fourth embodiment has the combined effects of the second embodiment and the third embodiment, that is, suppressing the generation of a depletion layer, fluctuations in parasitic capacitance can be reduced to suppress fluctuations in capacitance value.

(Modified Example of Capacitor Structure)

Figure 6:
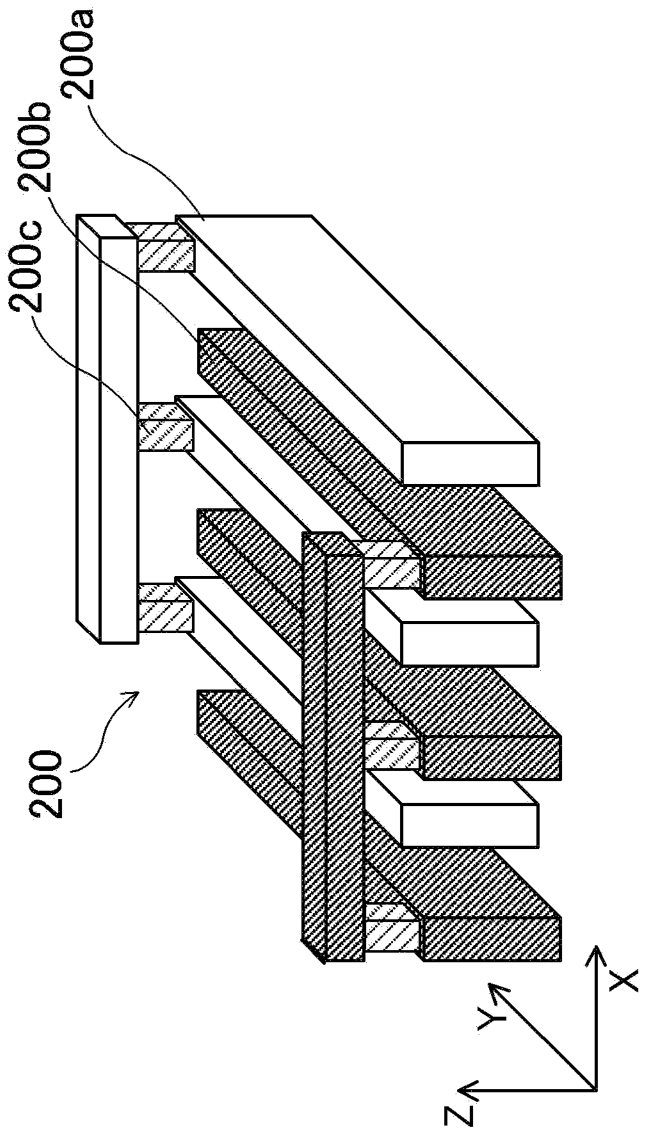
FIG. 6 is a schematic perspective view illustrating a modified example of the capacitor structure in each embodiment.

FIG. 6 is a schematic perspective view illustrating a modified example of the capacitor structure in each embodiment.

As illustrated in FIG. 6, a capacitor structure 200 may have a structure in which plate-shaped electrodes 200*a* and 200*b* are formed and arranged by providing line vias across the metal wiring layers M2 and M3, and connected by a via plug 200*c*. Thereby, the capacitor structure 200 can more easily obtain the main capacitance than the capacitor structure 150.

As described above, the capacitive element in an embodiment of the present invention includes a semiconductor substrate, a capacitor structure formed above the semiconductor substrate, and a shielding layer formed between the semiconductor substrate and the capacitor structure and electrically connected to the semiconductor substrate.

Thus, the capacitive element is capable of suppressing fluctuations in capacitance value due to application of a voltage.

What is claimed is:

1. A capacitive element, comprising:

a semiconductor substrate;

a capacitor structure formed above the semiconductor substrate; and a shielding layer formed between the semiconductor substrate and the capacitor structure and electrically connected to the semiconductor substrate, a well region is formed below the shielding layer on a front surface of the semiconductor substrate, the well region is formed to overlap with the shielding layer so as to surround a periphery of the shielding layer in a plan view, wherein a pair of electrodes in the capacitor structure are at a first potential and a second potential respectively, the well region and the shielding layer are at a third potential, and a range of the third potential is between the first potential and the second potential.

2. The capacitive element according to claim 1, wherein the third potential is an intermediate potential between the first potential and the second potential.

3. The capacitive element according to claim 1, wherein the capacitor structure generates main capacitance by electrostatic coupling in an electric field in an in-plane direction.

4. The capacitive element according to claim 1, wherein the shielding layer is formed to overlap with the capacitor structure so as to surround a periphery of the capacitor structure in a plan view.

5. The capacitive element according to claim 1, wherein a thermal oxide film is formed on the semiconductor substrate, and the shielding layer is a conductive polysilicon layer formed on the thermal oxide film.

6. The capacitive element according to claim 1, wherein the shielding layer is a conductive polysilicon layer, a conductivity type of the semiconductor substrate is P type, and conductivity types of the conductive polysilicon layer and the well region are both N type.

7. A semiconductor device, comprising the capacitive element according to claim 1.

* * * * *